(12) United States Patent
Shukla et al.

(10) Patent No.: US 11,276,688 B2
(45) Date of Patent: Mar. 15, 2022

(54) MONOLITHIC MULTI-CHANNEL DIODE ARRAY

(71) Applicant: Texas Instruments Incorporated, Dallas, TX (US)

(72) Inventors: Vrashank Gurudatta Shukla, Plano, TX (US); Mark Benjamin Welty, McKinney, TX (US); Lifang Lou, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/430,043

(22) Filed: Jun. 3, 2019

(65) Prior Publication Data

US 2020/0381424 A1 Dec. 3, 2020

(51) Int. Cl.
| | |
|---|---|
| H01L 27/08 | (2006.01) |
| H01L 23/495 | (2006.01) |
| H01L 29/66 | (2006.01) |
| H01L 29/06 | (2006.01) |
| H01L 29/866 | (2006.01) |
| H01L 27/02 | (2006.01) |

(52) U.S. Cl.
CPC .... *H01L 27/0814* (2013.01); *H01L 23/49562* (2013.01); *H01L 23/49575* (2013.01); *H01L 27/0248* (2013.01); *H01L 29/0649* (2013.01); *H01L 29/66106* (2013.01); *H01L 29/866* (2013.01)

(58) Field of Classification Search
CPC ........... H01L 27/0814; H01L 23/49562; H01L 23/49575; H01L 29/66106; H01L 29/0649; H01L 29/866; H01L 27/0248; H01L 27/0262; H01L 23/535; H01L 27/0255; H01L 29/8618; H01L 29/66113; H01L 29/0626; H01L 29/66121; H01L 29/7424; H01L 29/7412; H01L 27/075
USPC ....... 257/531, 536, 539, 565, 357, 577, 204, 257/369; 438/478, 510, 514, 522, 529, 438/542, 983
See application file for complete search history.

(56) References Cited

U.S. PATENT DOCUMENTS

| | | | |
|---|---|---|---|
| 9,773,777 B2 | 9/2017 | Strachan et al. | |
| 10,062,682 B1* | 8/2018 | Mallikarjunaswamy | ................... H01L 23/535 |
| 2015/0310358 A1* | 10/2015 | Khabazian | ......... G06Q 30/0201 705/7.35 |
| 2017/0084601 A1* | 3/2017 | Yao | ........................ H01L 29/866 |

(Continued)

*Primary Examiner* — Mouloucoulaye Inoussa
(74) *Attorney, Agent, or Firm* — Andrew R. Ralston; Charles A. Brill; Frank D. Cimino

(57) ABSTRACT

An electronic device includes a first-conductivity-type substrate and a second-conductivity-type epitaxial layer having a first dopant concentration. A first substrate region includes a second-conductivity-type buried layer and is enclosed by a first deep isolation structure. Within the first substrate region are a first doped region having the second conductivity type and a dopant concentration greater than the first dopant concentration and a second doped region having the first conductivity type. A second substrate region includes a first-conductivity-type buried layer and is enclosed by a second deep isolation structure. Within the second substrate region is a third doped region having the second conductivity type and a dopant concentration greater than the first dopant concentration.

23 Claims, 9 Drawing Sheets

(56) References Cited

U.S. PATENT DOCUMENTS

2017/0200712 A1* 7/2017 Strachan ............. H01L 29/6609
2018/0175018 A1* 6/2018 Suresh ............. H01L 29/66106

* cited by examiner

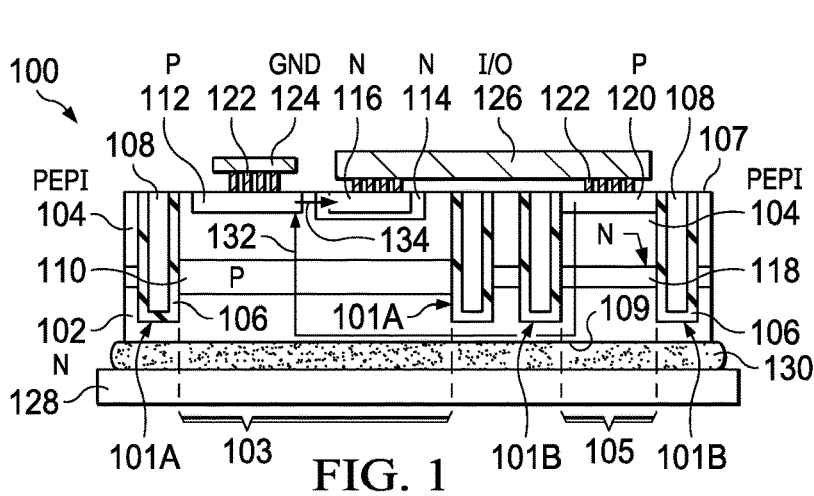
FIG. 1
FIG. 1A
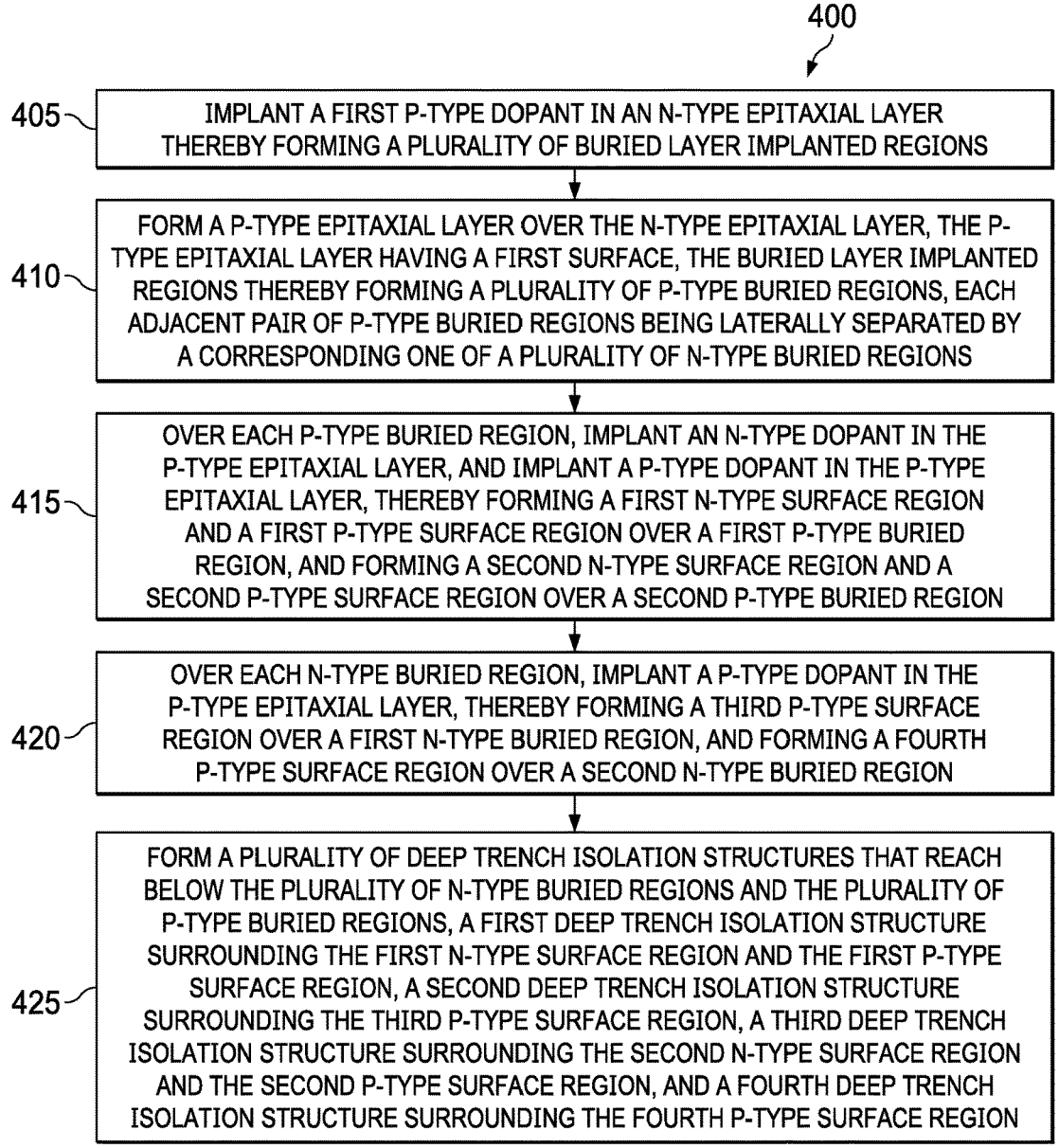
FIG. 4

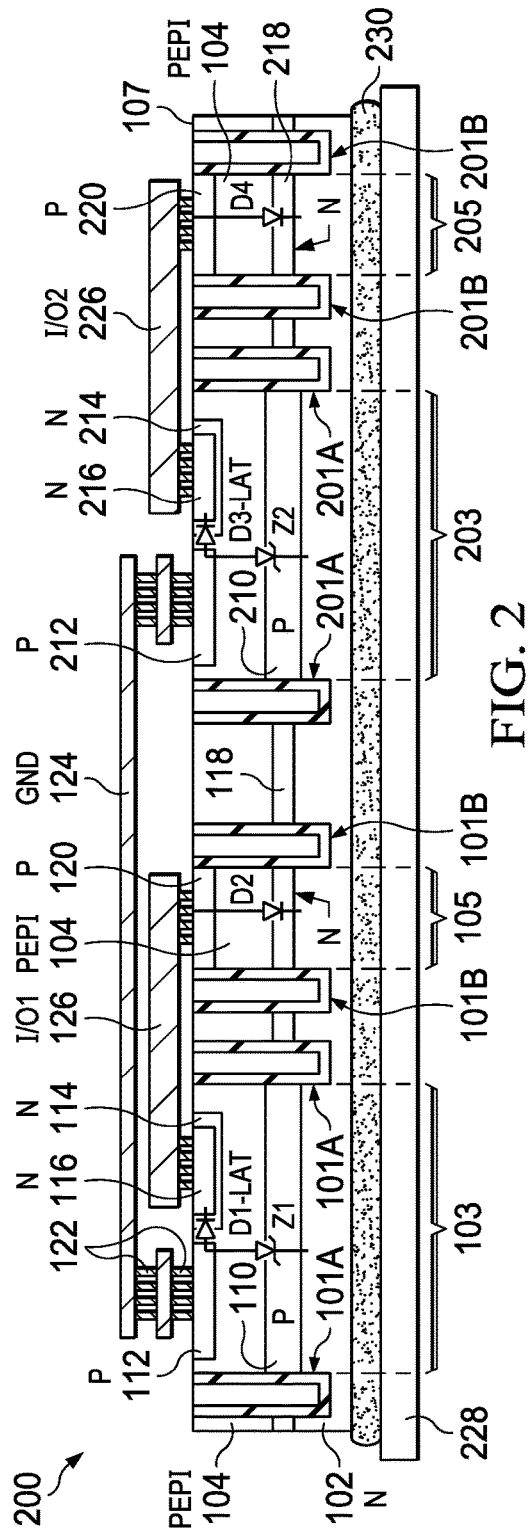
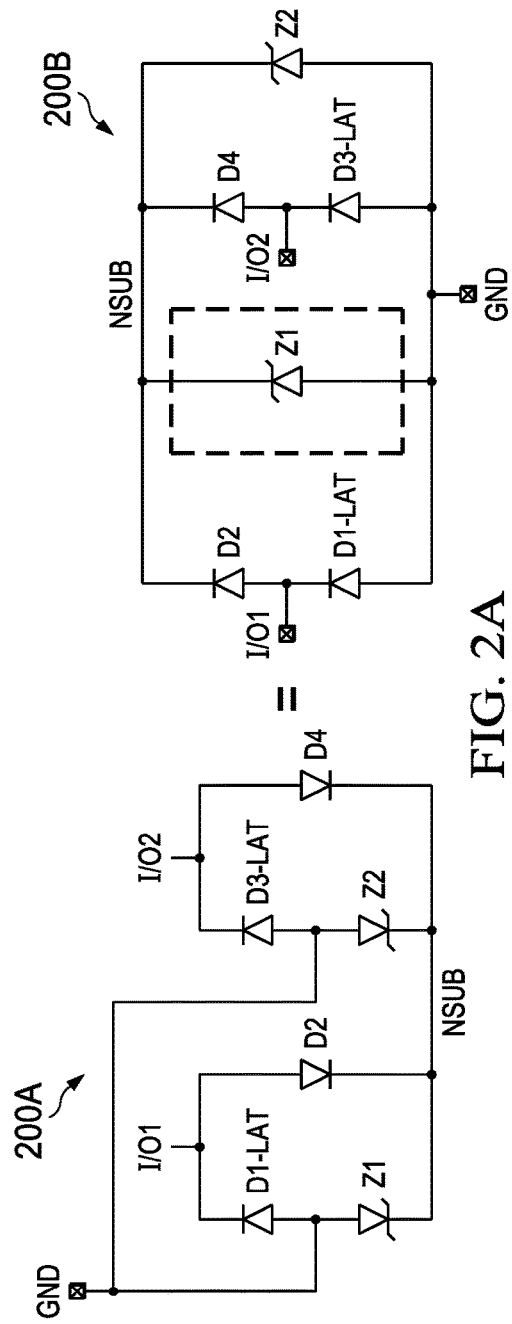
FIG. 2
FIG. 2A

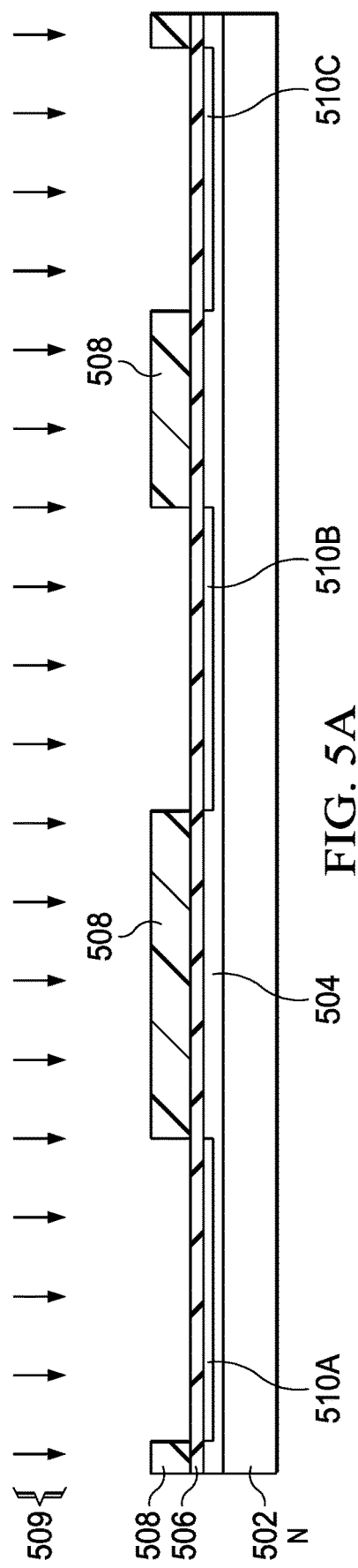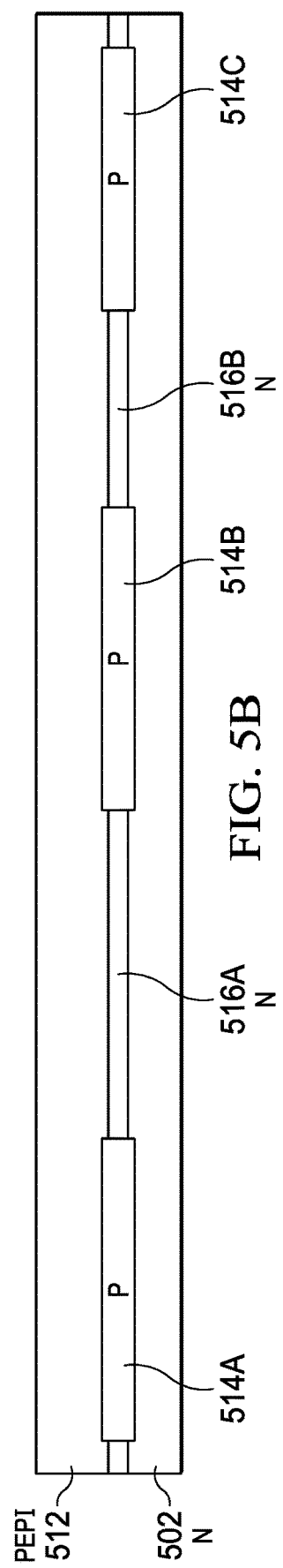

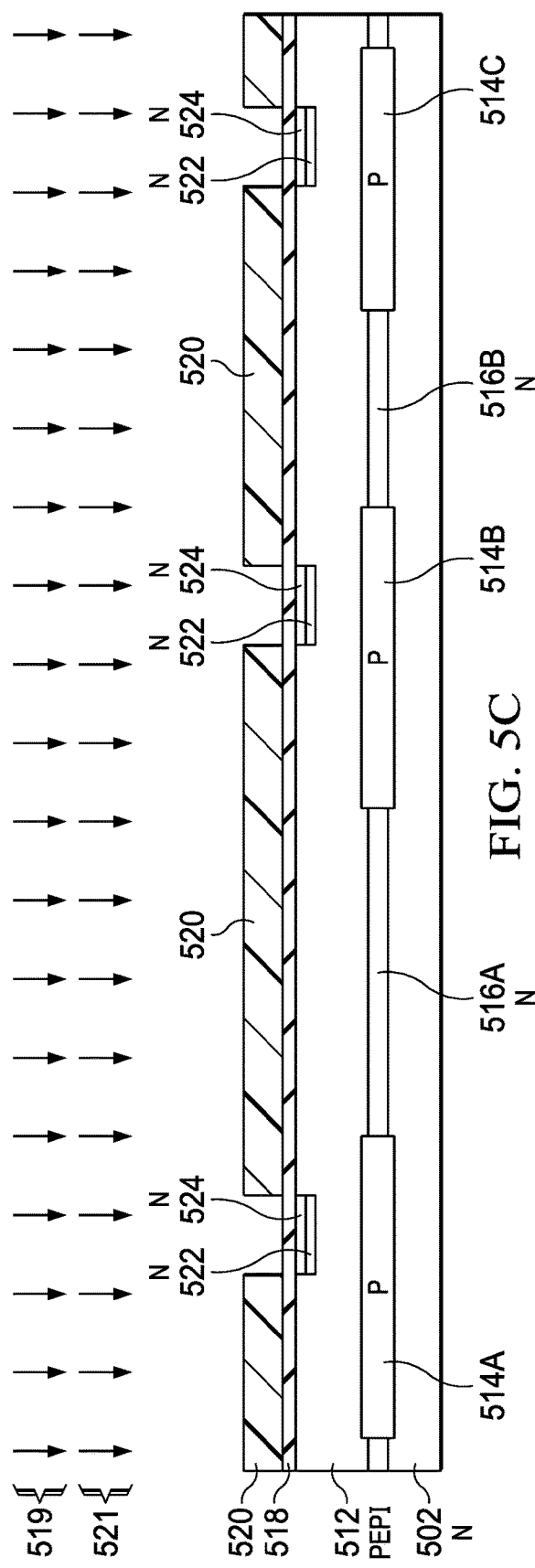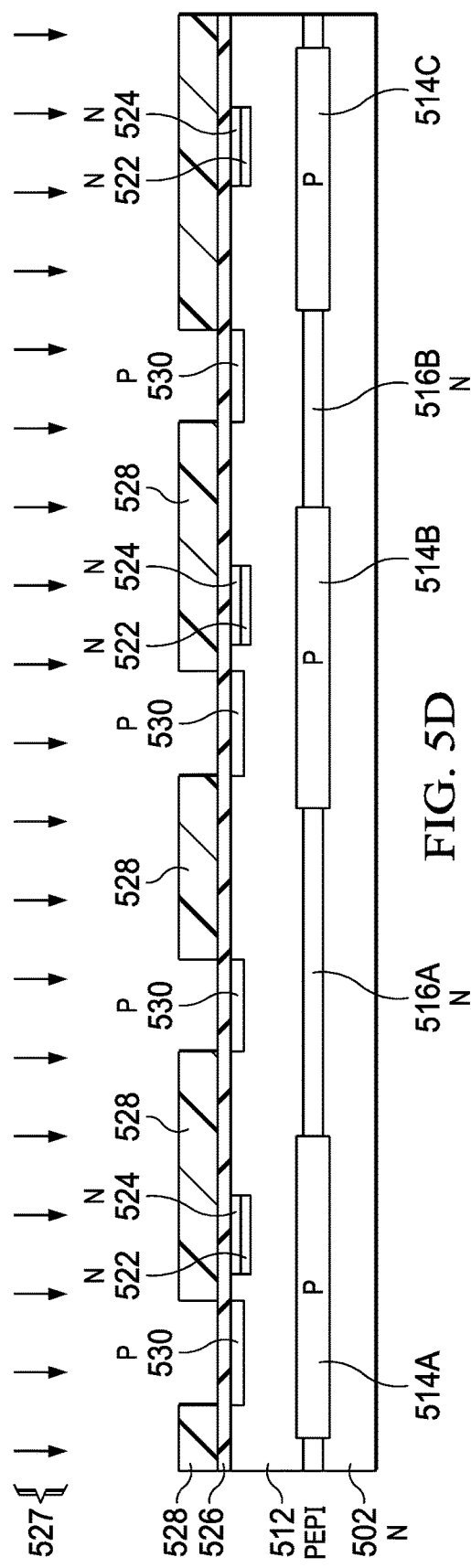

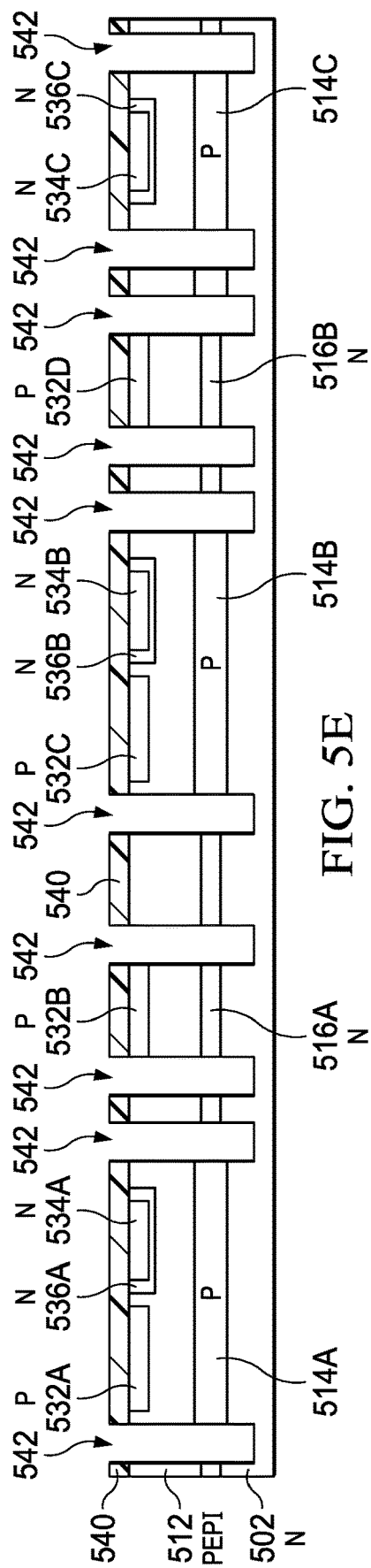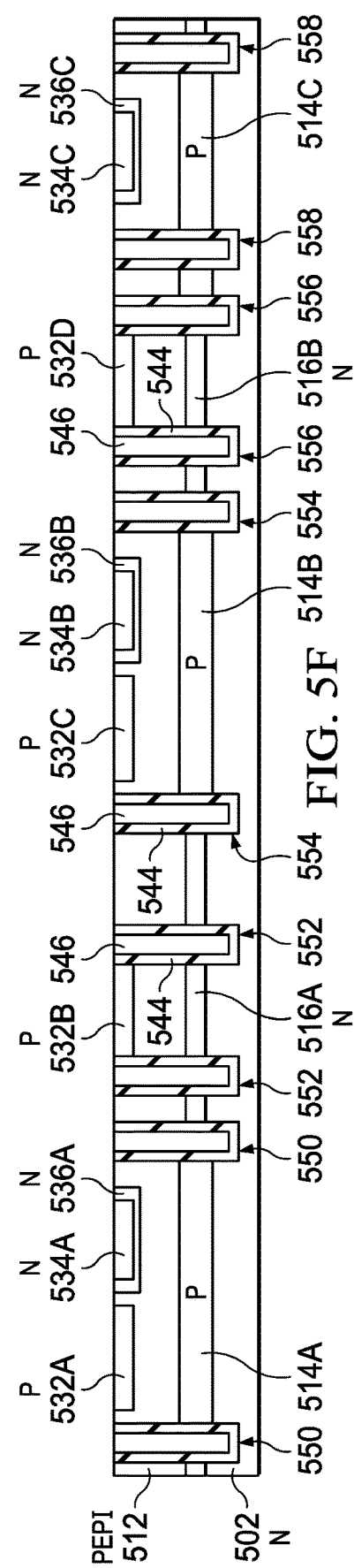

MONOLITHIC MULTI-CHANNEL DIODE ARRAY

FIELD OF THE DISCLOSURE

Disclosed examples relate generally to the field of diode arrays. More particularly, and not by way of any limitation, the present disclosure is directed to a monolithic multi-channel diode array.

SUMMARY

Disclosed examples provide a diode array that includes a lateral diode in a primarily vertical diode process. The lateral diode is used to move I/O connections to the same surface as the connection to a ground plane, which allows multi-channel unidirectional devices to be implemented in a single die while maintaining a smaller area by using the primarily vertical process.

In one aspect, an example of an electronic device is disclosed. The electronic device includes an epitaxial layer having a first surface and being located over a substrate having a first conductivity type, the epitaxial layer having a second conductivity type and a first dopant concentration, the substrate having a second surface opposing the first surface; a first substrate region comprising a first buried layer having the second conductivity type, the first substrate region being enclosed by a first deep isolation structure that extends from the first surface to a level below the first buried layer; a first doped region located within the first substrate region at the first surface, the first doped region having the second conductivity type and a dopant concentration greater than the first dopant concentration; a second doped region located within the first substrate region at the first surface, the second doped region having the first conductivity type; a second substrate region comprising a second buried layer having the first conductivity type, the second substrate region being enclosed by a second deep isolation structure that extends from the first surface to a level below the second buried layer; and a third doped region located within the second substrate region at the first surface, the third doped region having the second conductivity type and a dopant concentration greater than the first dopant concentration.

In one aspect, an example of an electrostatic discharge (ESD) protection device is disclosed. The ESD protection device includes a substrate that is N-type and has a bottom surface; a first epitaxial layer that is N-type located over the substrate; a second epitaxial layer that is P-type and located over the first epitaxial layer, the second epitaxial layer having a first P-type dopant concentration and a top surface opposed to the bottom surface; a first doped region that is P-type formed at the top surface, the first doped region having a P-type dopant concentration different than the first P-type dopant concentration; a second doped region formed at the top surface, the second doped region being N-type; a first buried layer located between the substrate and the second epitaxial layer; a first deep isolation structure enclosing the first doped region, the second doped region, and the first buried layer; a third doped region formed at the top surface, the third doped region being P-type and having a dopant concentration different than the first P-type dopant concentration, the first epitaxial layer forming a second buried layer between the substrate and the third doped region; and a second deep isolation structure enclosing the third doped region and the second buried layer.

In another aspect, an example of a method of fabricating an integrated circuit is disclosed. The method includes implanting a first P type dopant in an N-type epitaxial layer thereby forming a plurality of buried layer implanted regions; forming a P-type epitaxial layer over the N-type epitaxial layer, the P type epitaxial layer having a first surface, the buried layer implanted regions thereby forming a plurality of P type buried regions, each adjacent pair of P type buried regions being laterally separated by a corresponding one of a plurality of N-type buried regions; over each P-type buried region, implanting an N-type dopant in the P type epitaxial layer, and implanting a P-type dopant in the P-type epitaxial layer, thereby forming a first N-type surface region and a first P-type surface region over a first P-type buried region, and forming a second N-type surface region and a second P-type surface region over a second P-type buried region; over each N-type buried region, implanting a P-type dopant in the P type epitaxial layer, thereby forming a third P-type surface region over a first N-type buried region, and forming a fourth P-type surface region over second N-type buried region; forming a plurality of deep trench isolation structures that reach below the plurality of N-type buried regions and the plurality of P-type buried regions, a first deep trench isolation structure surrounding the first N-type surface region and the first P-type surface region, a second deep trench isolation structure surrounding the third P-type surface region, a third deep trench isolation structure surrounding the second N-type surface region and the second P-type surface region, and a fourth deep trench isolation structure surrounding the fourth P-type surface region.

BRIEF DESCRIPTION OF THE DRAWINGS

Examples of the present disclosure are illustrated by way of example, and not by way of limitation, in the figures of the accompanying drawings in which like references indicate similar elements. It should be noted that different references to "an" or "one" example in this disclosure are not necessarily to the same example, and such references may mean at least one. Further, when a particular feature, structure, or characteristic is described in connection with an example, it is submitted that it is within the knowledge of one skilled in the art to effect such feature, structure, or characteristic in connection with other examples whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary examples of the present disclosure. Various advantages and features of the disclosure will be understood from the following Detailed Description taken in connection with the appended claims and with reference to the attached drawing figures in which:

FIG. 1 depicts an example of a diode in an N-substrate-based vertical diode process according to an example of the disclosure;

FIG. 1A depicts an equivalent circuit associated with the diode of FIG. 1 according to an example of the disclosure;

FIG. 2 depicts an example of a diode array in an N-substrate-based vertical diode process according to an example of the disclosure;

FIG. 2A depicts two equivalent circuits associated with the diode array of FIG. 2 according to an example of the disclosure;

FIG. 4 depicts a method of fabricating an integrated circuit according to an example of the disclosure;

FIGS. 5A-5F depict the fabrication of a integrated circuit that comprises a diode array according to an example of the disclosure;

DETAILED DESCRIPTION OF THE DRAWINGS

Specific examples of the invention will now be described in detail with reference to the accompanying figures. In the following detailed description of examples of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6:
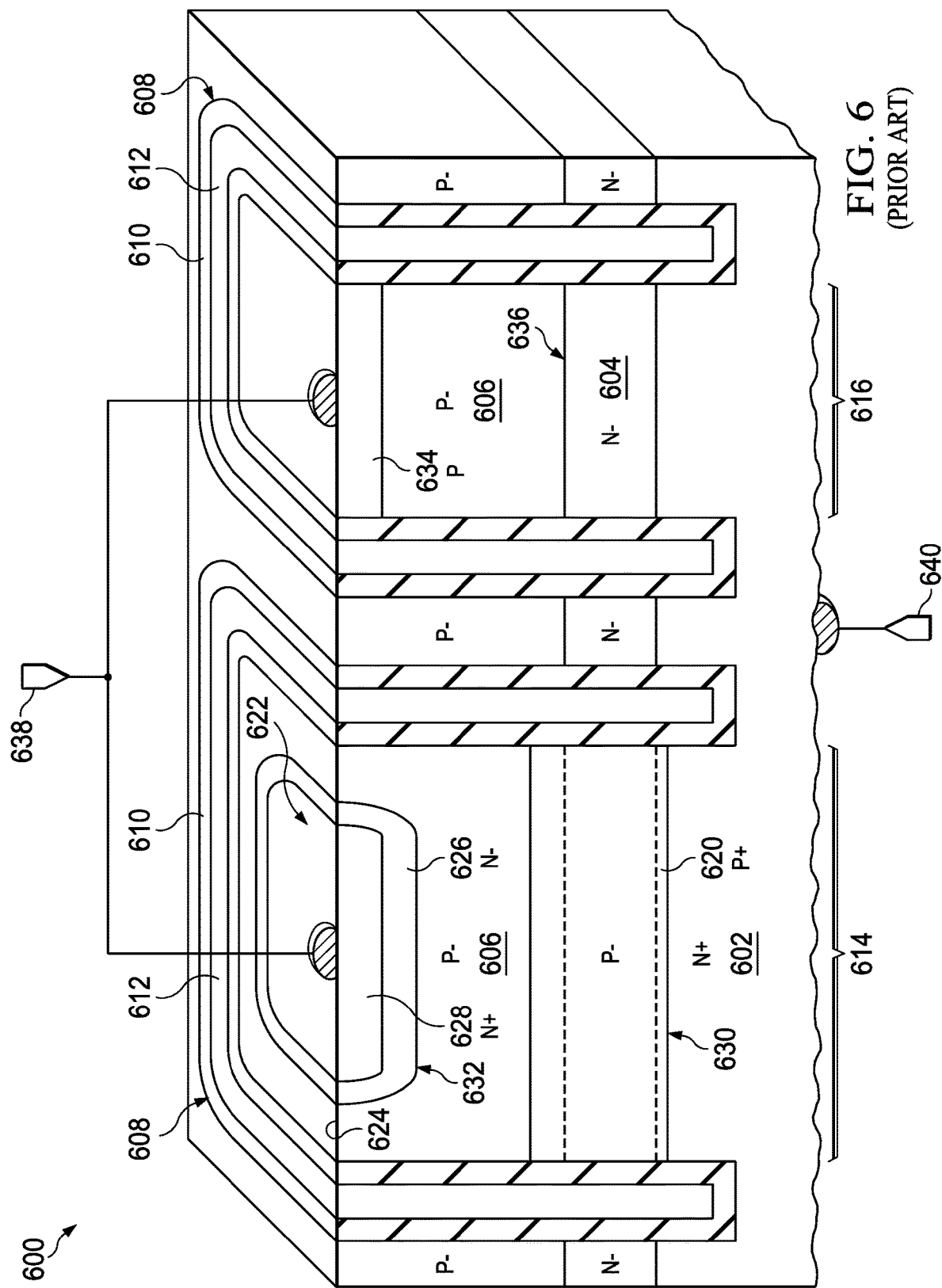
FIG. 6 depicts a cross-section of an example diode structure that forms part of a diode array in an N-substrate-based vertical diode process according to one prior art implementation.

FIG. 6 depicts a cross-sectional perspective of a diode structure 600 that forms part of a diode array. This figure is taken from U.S. Pat. No. 9,773,777, issued on Sep. 26, 2017 to Andrew Strachan et al., which is hereby incorporated by reference in its entirety. The elements of diode structure 600 are first discussed with reference to FIG. 6A, which depicts a diode circuit 600A formed by the depicted elements of diode structure 600. The following discussion gives an overview of the diode structure 600, while further details can be found in the original patent.

Figure 6A:
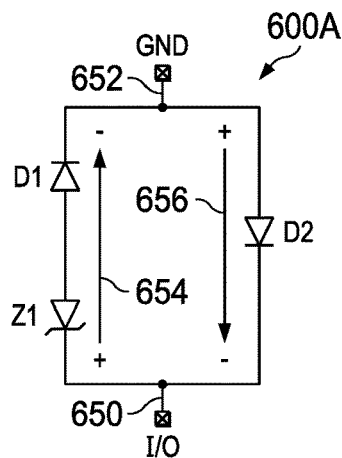
FIG. 6A depicts an equivalent circuit associated with the diode array of FIG. 6.

As seen in FIG. 6A, diode circuit 600A includes Zener diode Z1 and diode D1 coupled in series between a ground terminal 652 and an I/O terminal 650. When the ground terminal 652 is coupled to a ground plane and the I/O terminal 650 is coupled, e.g., to an I/O pin, an overvoltage on the I/O pin is routed to ground through Zener diode Z1 and diode D1 as depicted by arrow 654. Diode D2 is also coupled between the ground terminal 652 and the I/O terminal 650 to allow an undercurrent on the I/O pin to pull current from the ground connection through diode D2 as depicted by arrow 656.

Returning to FIG. 6, diode structure 600 includes a substrate 602 that is heavily doped N-type and an N-type layer 604 that is lightly-doped. In one example, the N-type layer 604 is an epitaxial layer having a thickness of 1-5 microns. Diode structure 600 also includes a lightly-doped P-type layer 606 of silicon-based semiconductor material disposed on the N-type layer 604. In one example, the P-type layer 606 is an epitaxial layer that is 3-8 microns thick.

One or more isolation structures 608 laterally isolate a first area 614 and also laterally isolate a second area 616. The isolation structures 608 may be deep trench isolation structures 608 with dielectric liners 610 and field plates 612 of polycrystalline silicon, referred to as polysilicon, inside the dielectric liners 610, as depicted in FIG. 6. Other physical forms for the isolation structures 608 are also possible. The first area 614 includes a number of regions from which Zener diode Z1 and diode D2 from FIG. 6A are formed and the second area 616 includes a number of doped regions from which diode D2 is formed.

A P-type buried layer 620 is disposed in first area 614, extending from the P-type layer 606 through the N-type layer 604 to the substrate 602. The original location of the N-type layer 604 within the P-type layer 620 is depicted in FIG. 6 for reference with dashed lines within the P-type buried layer 620. The P-type buried layer 620 may extend laterally across the first area 614 as depicted in FIG. 6. An N-type region 622 is disposed in the first area 614, within the P-type layer 606. The N-type region 622 may be an N-type well 622 extending to an upper surface 624 of the P-type layer 606. The N-type region 622 may include a lighter-doped outer portion 626 contacting the P-type layer 606 and a heavier-doped inner portion 628 surrounded by the lighter-doped outer portion 626.

A first PN junction 630 within the first area 614 is at a boundary between the P-type buried layer 620 and the N-type substrate 602. A second PN junction 632 is at a boundary between the P-type layer 606 and the N-type region 622. The first PN junction 630 defines Zener diode Z1 and the second PN junction 632 defines diode D1 of FIG. 6A, which are coupled anode-to-anode.

A breakdown voltage of the Zener diode Z1 as implemented in the first area 614 is determined by both the dopant density of the P-type buried layer 620 and the dopant density of the substrate 602 at the first PN junction 630. Desired values of the dopant density of the P-type buried layer 620 and the dopant density of the substrate 602 at the first PN junction 630 may be attained by selecting appropriate values for the thickness of the N-type layer 604 and the peak dopant density of the P-type buried layer 620. Increasing the thickness of the N-type layer 604 moves the peak of the dopant distribution in the P-type buried layer 620 away from the substrate 602 and thus reduces the dopant density of the P-type buried layer 620 and the dopant density of the substrate 602 at the first PN junction 630, and thus increase the breakdown voltage. Conversely, increasing the peak dopant density of the P-type buried layer 620 will increase the dopant density of the P-type buried layer 620 and the dopant density of the substrate 602 at the first PN junction 630, and thus reduce the breakdown voltage.

A capacitance of the first area 614 is predominantly determined by a capacitance of the second PN junction 632, which is affected by dopant densities of the P-type layer 606 and the N-type region 622 at the second PN junction 632. The N-type region 622 is separated from the P-type buried layer 620 by at least 2 microns, which provides a sufficient distance for a depletion region in the P-type layer 606 when the second PN junction 632 is reverse biased, and provides a suitably low ohmic resistance in the P-type layer 606 when the second PN junction 632 is forward biased.

A dynamic resistance of Zener diode Z1 and diode D1 in the first area 614 is predominantly determined by the dopant density in the substrate 602, which is highly doped to reduce the dynamic resistance. A desired value for the dopant density in the substrate 602 may advantageously be attained without degrading the breakdown voltage, because the breakdown voltage may be attained by selecting appropriate values for the thickness of the N-type layer 604 and the peak dopant density of the P-type buried layer 620, independently of the dopant density in the substrate 602. A lateral size of the first area 614 is selected to provide a desired current capacity.

A P-type region 634, for example a P-type well 634, is disposed in the P-type layer 606 in the second area 616, extending to the upper surface 624 of the P-type layer 606. There is at least a micron of vertical separation between the P-type region 634 and the N-type layer 604. The P-type region 634 may extend across the second area 616 as depicted in FIG. 6, or may be recessed from the isolation structures 608. The P-type region 634 may provide a desired low resistance contact to the second area 616. A third PN junction 636 of the second area 616 is at a boundary of the N-type layer 604 and the P-type layer 606. The P-type buried layer 620 in the first area 614 does not extend into the second area 616. A breakdown voltage of the third PN junction 636 is significantly higher than the breakdown voltage of the first PN junction 630 of the first area 614, due to the lower dopant densities of the N-type layer 604 and the P-type layer 606 compared to the dopant densities of the P-type buried layer 620 and the substrate 602. A capacitance of the second area 616 is determined by the dopant densities of the N-type layer 604 and the P-type layer 606 at the third PN junction 636 and may be comparable to the capacitance of the first area 614. The capacitances of the first area 614 and the second area 616 are advantageously low due to the low dopant densities of the N-type layer 604 and the P-type layer 606, compared to diodes with higher dopant densities. A dynamic resistance of the second area 616 is predominantly determined by the dopant density in the substrate 602.

A first terminal 638 of the diode structure 600 is electrically connected to the N-type region 622 of the first area 614 and to the P-type region 634 of the second area 616. A second terminal 640 is electrically connected to the substrate 602. During operation of the diode structure 600, a voltage excursion which is positive on the first terminal 638 relative to the second terminal 640 forward biases the diode D2 formed in second area 616 and is thus shunted through the second area 616. A voltage excursion which is negative on the second terminal 640 relative to the first terminal 638 forward biases the second PN junction 632, e.g. diode D1, and causes breakdown in the first PN junction 630, e.g., Zener diode Z1, in the first area 614 and is thus shunted through the first area 614.

In an N-substrate based vertical diode process as is shown in FIG. 6, an I/O pin that is being protected is coupled to second terminal 640 on the N-substrate. Because the N-substrate provides a common node, an implementation of multi-channel unidirectional ESD protection diodes in an N-substrate based vertical diode process requires multiple dies in a multi-chip-module (MCM) configuration so that the individual I/O pins are isolated.

Figure 6B:
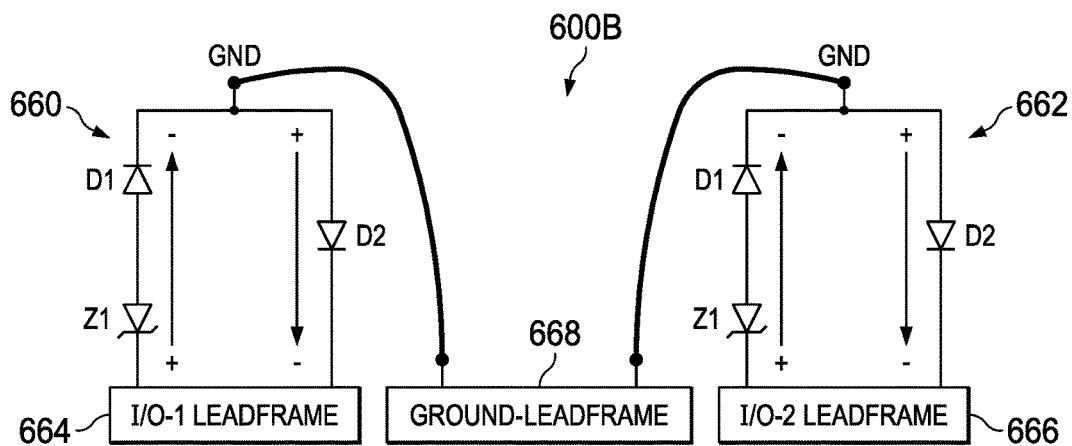
FIG. 6B depicts leadframe attachments for a multi-channel example of the diode array of FIG. 6.

FIG. 6B depicts an example of an MCM having a two-channel unidirectional diode array 600B that is mounted to a number of leadframes. Unidirectional diode array 600B includes a first diode circuit 660, which is mounted to a first I/O leadframe 664 to provide ESD protection to a first I/O channel, and second diode circuit 662, which is mounted to a second I/O leadframe 666 to provide ESD protection to a second I/O channel. The ground connections for first diode circuit 660 and second diode circuit 662 are each coupled to a ground leadframe 668. Although MCM implementations such as shown in FIG. 6B are currently necessary to provide multi-channel unidirectional diode arrays, the MCM implementation increases the product cost, reduces the packaging options and, in some cases, may require custom package leadframe development.

Figure 7:
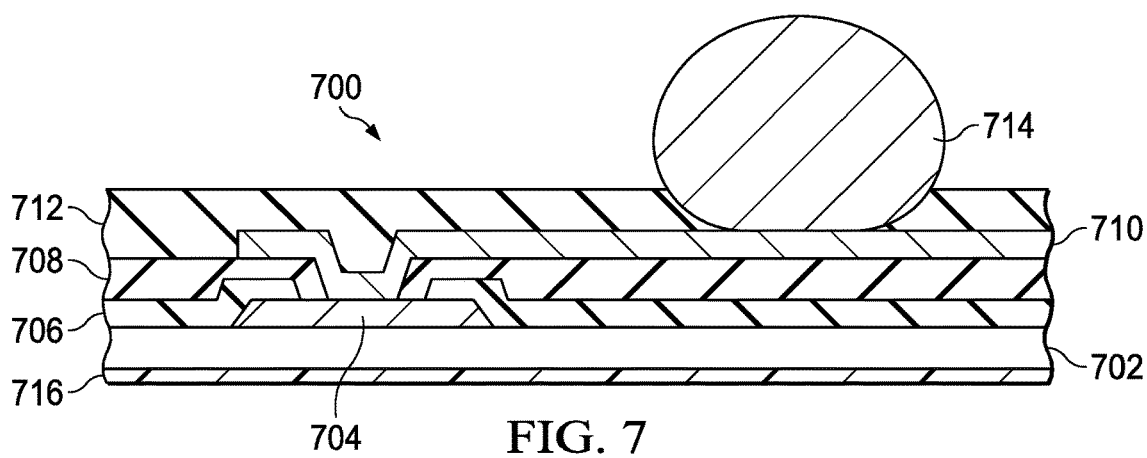
FIG. 7 depicts a cross-section of a portion of an example WCSP.

Another desirable packaging option is the wafer-level chip-scale package (WCSP), which allows the package size to be reduced to the size of the die itself. FIG. 7 depicts a cross-section through a portion of a generic WCSP 700 for illustration. WCSP 700 starts with a die 702 that has been fabricated using a semiconductor fabrication process. Die 702 includes bond pads, such as bond pad 704, and a die passivation layer 706.

In the example shown, a first dielectric layer 708 has been formed on the upper surface of the die 702 and patterned, and a conductive redistribution layer (RDL) 710 has been formed in the patterned first dielectric layer 708. A second dielectric layer 712 covers first dielectric layer 708 and conductive RDL 710, except where an array of solder balls, such as solder ball 712, is formed on exposed portions of the RDL 710.

The first dielectric layer 708 and the second dielectric layer 712 for WCSP 700 are generally deposited dielectric polymer films, such as bisbenzocyclobutene (BCB) or polyimides. The portions of the conductive RDL 710 that contact the bond pad 704 and the portions of the solder balls 714 that contact the conductive RDL 710 can include one or more adhesion or diffusion barrier layers (not specifically shown) formed therebetween. A backside coating 716 can also be deposited for protection if desired.

In FIG. 7, the layers that are added after fabrication of the die are fabricated on the intact wafer. This is followed, after desired testing of the wafer, by singulating individual dies. The WCSP 700 is thus the same size as the individual die and able to provide a very small package.

As previously mentioned with reference to FIG. 6A, the current flow through diode circuit 600A is either from the I/O terminal 650 to the ground terminal 652 through Zener diode Z1 and diode D1 or else from the ground terminal 652 to I/O terminal 650 through diode D2. Due to this terminal configuration the WCSP option has been heretofore unavailable for multi-channel unidirectional diode arrays. However, Applicants have determined that by making the anode of diode D1 accessible from the upper surface of the wafer, e.g., by providing diode D1 as a lateral diode, both of the contacts for the circuit can be accessible from the upper surface. This terminal configuration is compatible with the WCSP. Thus, examples described below may be implemented with a WCSP with the associated benefit of decreased package size.

FIG. 1 depicts a cross-section through an example of a diode network structure 100 that can be used as an ESD protection device according to an example of the disclosure, in which the diode D1 of the diode circuit 600A is realized as a lateral diode. FIG. 1A depicts an equivalent diode circuit 100A of the diode network structure 100. In the diode circuit 600A (FIG. 6A), ground terminal 652 is connected to the cathode of first diode D1 and the anode of second diode D2, while the I/O terminal is connected to the substrate. However, in diode circuit 100A, a ground node is coupled to the common anode between lateral first diode D1 and first Zener diode Z1, and the I/O terminal is coupled to the cathode of lateral first diode D1 and to the anode of second diode D2. The current flow is shown in FIG. 1 as described below.

Referring to FIG. 1, the diode network structure 100 includes a substrate 102 that has a first conductivity type and an epitaxial layer 104 that has a second conductivity type and a first dopant concentration. In the example shown, the first conductivity type is N-type and the second conductivity type is P-type. The substrate 102 has an average dopant density greater than about $1\times10^{18}$ cm$^{-3}$. In one example, epitaxial layer 104 may be boron doped and the first dopant concentration has an average dopant density less than about $1\times10^{15}$ cm$^{-3}$. A first deep isolation structure 101A extends from a first surface 107, which is opposite the substrate, through epitaxial layer 104 into substrate 102 and encloses a first substrate region 103; a second deep isolation structure 101B extends from the first surface 107 through epitaxial layer 104 into substrate 102 and encloses a second substrate region 105. Because first deep isolation structure 101A and second deep isolation structure 101B each enclose a respective region, this cross-section shows two sections of these deep isolation structures. In one example, first deep isolation structure 101A and second deep isolation structure 101B include a dielectric layer 106 that can be a thick oxide lining and have a filling of polysilicon 108.

First substrate region 103 includes a first buried layer 110 that contacts both substrate 102 and epitaxial layer 104 and that in one example is P-type. In one example, first buried layer 110 has a peak dopant density greater than about $1\times10^{17}$ cm$^{-3}$. First substrate region 103 includes a first doped region 112 that is formed at the first surface 107. First doped region 112 is P-type with a dopant concentration greater than the first dopant concentration and forms the anode of first diode D1. The cathode of first diode D1 is formed by a second doped region that in one example includes a first sub-region 114 and a second sub-region 116 that is contained within first sub-region 114. Both first sub-region 114 and second sub-region 116 are formed at the first surface 107 and are doped N-type, with first sub-region 114 having a second dopant concentration and second sub-region 116 having a dopant concentration that is greater than the second dopant concentration. The junction between first buried layer 110 and substrate 102 forms first Zener diode Z1.

Second substrate region 105 includes a second buried layer 118, which in one example is N-type. In one example, second buried layer 118 may be doped with phosphorus and has an average dopant density less than about $1\times10^{16}$ cm$^{-3}$. In one example, second buried layer 118 can be part of another epitaxial layer that lies between the substrate 102 and epitaxial layer 104. Second substrate region 105 also includes a third doped region 120 that is formed at the first surface 107 and is doped P-type, with a dopant concentration greater than the first dopant concentration. Third doped region 120 forms the anode of second diode D2, while the cathode of second diode D2 is formed by second buried layer 118. In one example, first doped region 112 and third doped region 120 may have an average dopant density of at least $1\times10^{17}$ cm$^{-3}$; first sub-region 114 may have an average dopant density of, for example, $1\times10^{16}$ cm$^{-3}$ to $1\times10^{17}$ cm$^{-3}$; and second sub-region 116 may have an average dopant density of, for example, $1\times10^{17}$ cm$^{-3}$ to $3\times10^{19}$ cm$^{-3}$.

As shown in FIG. 1, first doped region 112 is contacted by vias 122 that conductively couple first doped region 112 to a first metal routing segment 124 that is dedicated to a ground connection, e.g. the ground node of the equivalent circuit 100A. Both second sub-region 116 and third doped region 120 are contacted by vias 122 that conductively couple second sub-region 116 and third doped region 120 to a second metal routing segment 126 that is dedicated to an I/O connection, e.g. the I/O terminal of equivalent circuit 100A. Because contacts to both ground and the I/O inputs are provided on the first surface 107, a second surface 109 of diode network structure 100 can be attached to leadframe 128 using a non-conductive die attach 130 (e.g. an adhesive), where second surface 109 is the surface opposite the first surface 107. Because the second surface 109 is generally the surface attached to a leadframe, first surface 107 may also be considered a top surface and the second surface 109 may be considered a bottom surface.

The different configuration of the diode structure 600 relative to the diode network structure 100 results in a different current flow during an overcurrent or under-current event. When an overcurrent event occurs on a pin coupled to second metal routing segment 126, the overcurrent flows through third doped region 120 through epitaxial layer 104, second buried layer 118, and along substrate 102 to reach first buried layer 110, epitaxial layer 104 and first doped region 112, as shown by arrow 132. When an undercurrent event occurs on a pin coupled to second metal routing segment 126, the current from ground is much more direct, being simply from first doped region 112 to second sub-region 116, as shown by arrow 134.

FIG. 2 depicts a cross-section through a diode array structure 200 that can be utilized in a unidirectional, multi-channel configuration. FIG. 2A illustrates an equivalent circuit 200A that may represent the diode array structure 200, as described further below. Diode array structure 200 includes each of the elements of the diode network structure 100 (FIG. 1), including first substrate region 103, second substrate region 105 and the respective doped regions formed in each of first substrate region 103 and second substrate region 105, which can be attached to a single communication channel. Diode array structure 200 also includes a third substrate region 203 and a fourth substrate region 205, where the doped regions therein can be coupled to a second communication channel.

In the example shown in FIG. 2, each of first substrate region 103, second substrate region 105, third substrate region 203 and fourth substrate region 205 is surrounded by a deep isolation structure. First deep isolation structure 101A surrounds first substrate region 103, second deep isolation structure 101B surrounds second substrate region 105, third deep isolation structure 201A surrounds third substrate region 203 and fourth deep isolation structure 201B surrounds fourth substrate region 205.

First substrate region 103 contains the first buried layer 110, which in one example is P-type. First substrate region 103 also includes the first doped region 112, which is P-type and which forms the anode of a first diode D1. The cathode of first diode D1 is formed by a second doped region that in this example includes first sub-region 114 and a second sub-region 116 that is contained within first sub-region 114. Both first sub-region 114 and second sub-region 116 are doped N-type, with first sub-region 114 having a second dopant concentration and second sub-region 116 having a dopant concentration greater than the second dopant concentration. The junction between first buried layer 110 and substrate 102 forms a first Zener diode Z1.

Second substrate region 105 includes a second buried layer 118, which in one example is N-type. Second substrate region 105 also includes a third doped region 120 that is doped P-type, which forms the anode of a second diode D2, while the cathode of second diode D2 is formed by second buried layer 118.

Third substrate region 203 contains a third buried layer 210, which in one example is P-type. Third substrate region 203 also includes a fourth doped region 212, which is P-type and which forms the anode of a third diode D3. The cathode of third diode D3 is formed by a fifth doped region that in one example includes a third sub-region 214 and a fourth sub-region 216 that is contained within third sub-region 214. Both third sub-region 214 and fourth sub-region 216 are doped N-type, with third sub-region 214 having a third dopant concentration and fourth sub-region 216 having a dopant concentration greater than the third dopant concentration. Optionally the dopant concentrations of the third sub-region 214 and the fourth sub-region 216 may be about the same as the first sub-region 114 and the second sub-region 116, respectively. The junction between third buried layer 210 and substrate 102 forms a second Zener diode Z2.

Fourth substrate region 205 includes a fourth buried layer 218, which in one example is N-type. Fourth substrate region 205 also includes a sixth doped region 220 that is doped P-type, which forms the anode of a fourth diode D4, while the cathode of fourth diode D4 is formed by fourth buried layer 218.

In one example, first buried layer 110 and third buried layer 210 may have a peak dopant density greater than about $1 \times 10^{17}$ cm$^{-3}$; second buried layer 118 and fourth buried layer 218 may have an average dopant density less than about $1 \times 10^{16}$ cm$^{-3}$; first doped region 112, third doped region 120, fourth doped region 212 and sixth doped region 220 each may have an average dopant density of at least $1 \times 10^{17}$ cm$^{-3}$; first sub-region 114 and third sub-region 214 may have an average dopant density of, for example, $1 \times 10^{16}$ cm$^{-3}$ to $1 \times 10^{17}$ cm$^{-3}$; and second sub-region 116 and fourth sub-region 216 may have an average dopant density of, for example, $1 \times 10^{17}$ cm$^{-3}$ to $3 \times 10^{19}$ cm$^{-3}$.

In the diode array structure 200 (FIG. 2), first metal routing segment 124 is extended so that the first metal routing segment 124 contacts both first doped region 112 and fourth doped region 212. Second metal routing segment 126 is again conductively coupled to both second sub-region 116 and third doped region 120 in order to provide a connection to a first I/O channel, while a third metal routing segment 226 is conductively coupled to both fourth sub-region 216 and sixth doped region 220 in order to provide a connection to a second I/O channel. Once the diode array structure 200 is completely fabricated, substrate 102 is attached to leadframe 228 using a non-conductive die attach 230.

FIG. 2A depicts equivalent circuits that represent the diode array structures shown in FIG. 2. On the left-hand side, equivalent circuit 200A includes two copies of the diode circuit 100A, along with their connections to ground and to I/O channel 1 and I/O channel 2. In the circuit for the first I/O channel, the ground is coupled to the anode of first diode D1 and to the anode of first Zener diode Z1. In the circuit for the second I/O channel, the ground is coupled to the anode of third diode D3 and to the anode of second Zener diode Z2. On the right-hand side, equivalent circuit 200B depicts the diode array being coupled between substrate connection NSUB and ground connection GND. This right-hand configuration helps to illustrate a disadvantage of the vertical process having a lateral first diode D1, e.g., that an effect known as snapback is lost. When the first Zener diode Z1 and first diode D1, or the second Zener diode Z2 and third diode D3, are coupled together in the same current flow, the clamping voltage is lower due to a lower holding voltage. Because these diodes are now decoupled, they have lost the lower holding voltage advantage that the circuit previously had.

Figure 3:
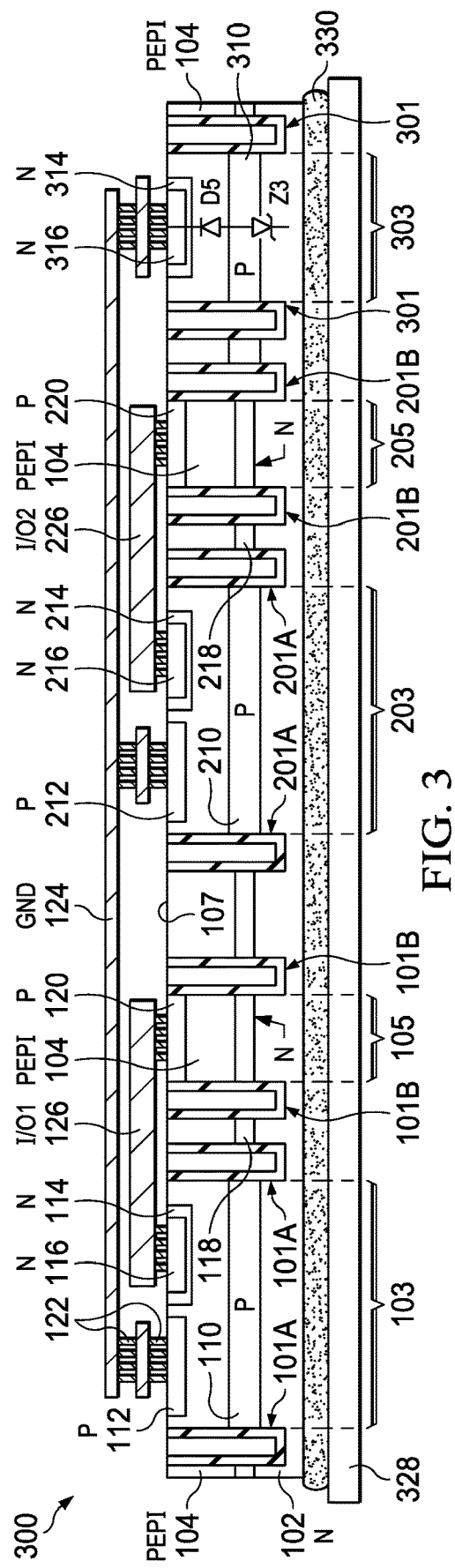
FIG. 3 depicts an example of a diode array in an N-substrate-based vertical diode process according to an example of the disclosure.
Figure 3A:
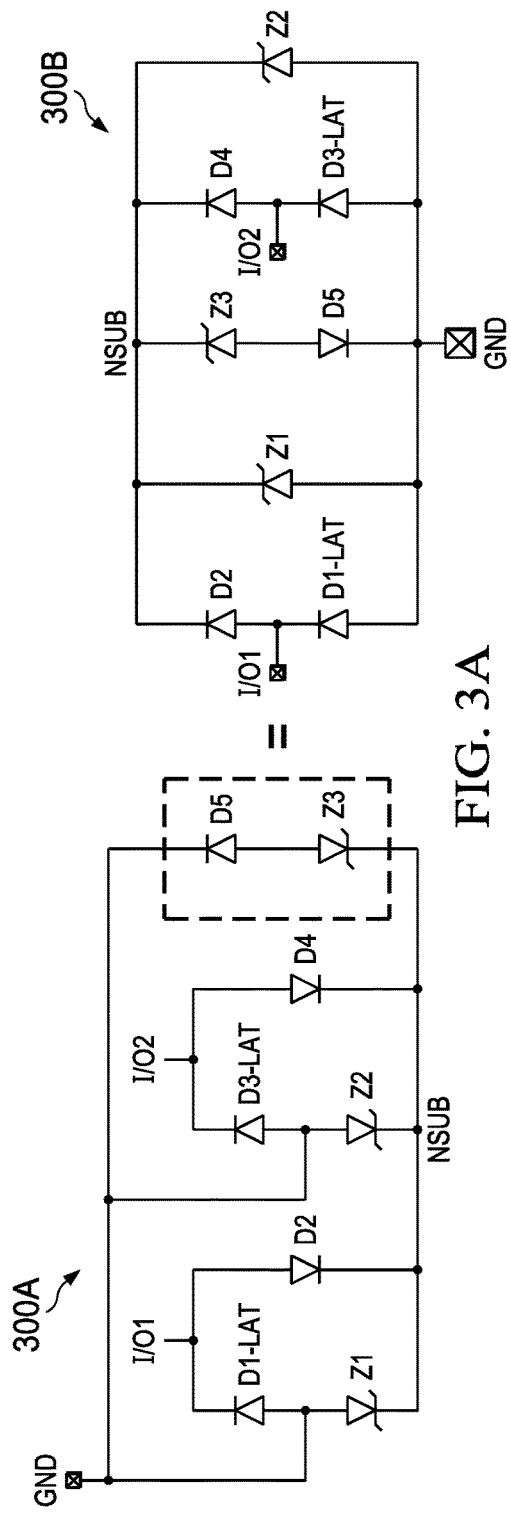
FIG. 3A depicts two equivalent circuits associated with the diode array of FIG. 3 according to an example of the disclosure.

FIG. 3 depicts a cross-section through a diode array structure 300 that contains an addition to correct the loss of snapback. FIG. 3A illustrates an equivalent circuit 300A that may represent the diode array structure 300, as described further below. Diode array structure 300 includes the elements of diode array structure 200, and additionally includes fifth substrate region 303, which is enclosed by a fifth deep isolation structure 301. Fifth substrate region 303 has a fifth buried layer 310, which in one example is P-type. Fifth substrate region 303 also contains a seventh doped region that in one example includes a fifth sub-region 314 and a sixth sub-region 316 that is contained within fifth sub-region 314. Both fifth sub-region 314 and sixth sub-region 316 are doped N-type, with fifth sub-region 314 having a fourth dopant concentration and sixth sub-region 316 having a dopant concentration greater than the fourth dopant concentration. In one example, first buried layer 110 may have a peak dopant density greater than about $1 \times 10^{17}$ cm$^{-3}$; second buried layer 118 may have an average dopant density less than about $1 \times 10^{16}$ cm$^{-3}$; first doped region 112, third doped region 120, fourth doped region 212 and sixth doped region 220 each may have an average dopant density of at least $1 \times 10^{17}$ cm$^{-3}$; first sub-region 114, third sub-region 214 and fifth sub-region 314 may have an average dopant density of, for example, $1 \times 10^{16}$ cm$^{-3}$ to $1 \times 10^{17}$ cm$^{-3}$; and second sub-region 116, fourth sub-region 216 and sixth sub-region 316 may have an average dopant density of, for example, $1 \times 10^{17}$ cm$^{-3}$ to $3 \times 10^{19}$ cm$^{-3}$.

The junction between epitaxial layer 104 and fifth sub-region 314 forms a fifth diode D5 while the junction between fifth buried layer 310 and substrate 102 forms a third Zener diode Z3. Sixth sub-region 316 is coupled to first metal routing segment 124, which in operation is coupled to the ground plane. The reintroduction of a diode D5/Zener diode Z3 pair coupled in parallel with the rest of the circuit may provide a shallow snapback. Although not specifically shown, any of diode network structure 100, diode array structure 200, diode array structure 300 can be processed as a WCSP.

In the diode array structure 300, first metal routing segment 124 is further extended so that the first metal routing segment 124 contacts first doped region 112, fourth doped region 212 and sixth sub-region 316. Second metal routing segment 126 is again conductively coupled to both second sub-region 116 and third doped region 120 in order to provide a connection to a first I/O channel, and third metal routing segment 226 is conductively coupled to both fourth sub-region 216 and sixth doped region 220 in order to provide a connection to a second I/O channel. Once the diode array structure 300 is completely fabricated, substrate 102 is attached to leadframe 328 using a non-conductive die attach 330.

The left-hand side of FIG. 3A depicts a diode array circuit 300A that illustrates the diode array structure 300. The right-hand side of FIG. 3A depicts an equivalent circuit 300B that demonstrates the addition of a diode D5/Zener diode Z3 pair coupled in parallel with the other Zener diodes such that snapback is provided.

FIG. 4 depicts a flowchart of a method 400 of fabricating an integrated circuit and is discussed in conjunction with FIGS. 5A-5F, each of which depicts a wafer at the different stages of fabrication. Method 400 begins with implanting 405 a first P-type dopant in an N-type epitaxial layer, thereby forming a plurality of buried layer implanted regions. In one example, the first P-type dopant can be boron, and possibly gallium or indium and have a dosage of at least $3 \times 10^{13}$ cm$^{-2}$ to provide a peak dopant density greater than $1 \times 10^{17}$ cm$^{-3}$.

FIG. 5A depicts a substrate 502 having an N-type epitaxial layer 504. A first implant mask includes a layer of photoresist 508 that has been deposited and patterned over an oxide layer 506 that protects the silicon underlying the surface of the wafer. The P-type implant 509 creates first buried layer implanted region 510A, second buried layer implanted region 510B, and third buried layer implanted region 510C.

Returning to FIG. 4, after removal of the layer of photoresist 508 and the oxide layer 506, the method continues with forming 410 a P-type epitaxial layer over the N-type epitaxial layer, the P-type epitaxial layer having a first surface. The buried layer implanted regions thereby form a plurality of P-type buried regions, with each adjacent pair of P-type buried regions being laterally separated by a corresponding one of a plurality of N-type buried regions. In other words, during the growth of the second epitaxial layer, the first buried layer implanted regions diffuse both upwards into the forming second epitaxial layer and downward to contact the substrate, thereby forming the plurality of P-type buried regions while remaining portions of the first epitaxial layer thereby form the plurality of N-type buried regions. FIG. 5B depicts the newly grown P-type epitaxial layer 512, as well as the first P-type buried region 514A, second P-type buried region 514B, and third P-type buried region 514C and the remaining portions of first epitaxial layer 504 that form the first N-type buried region 516A and second N-type buried region 516B.

In FIG. 4, the method implants 415, over each P-type buried region, an N-type dopant in the P-type epitaxial layer, and implants a P-type dopant in the P-type epitaxial layer, thereby forming a first N-type surface region and a first P-type surface region over a first P-type buried region, and forming a second N-type surface region and a second P-type surface region over a second P-type buried region. The method also implants 420, over each N-type buried region, a P-type dopant in the P-type epitaxial layer, thereby forming a third P-type surface region over a first N-type buried region, and forming a fourth P-type surface region over a second N-type buried region.

One implementation of implanting the N-type dopant in the P-type epitaxial layer is shown in FIG. 5C and includes two separate implants of N-type dopants. In this example, a layer of oxide 518 has been grown on the P-type epitaxial layer 512 and a photoresist layer 520 has been deposited and patterned. N-type implant 519 creates a first set of N-type regions 522 and an N-type implant 521 creates a second set of N-type regions 524. These regions are shown at this stage in their un-diffused state; the first set of N-type regions 522 and the second set of N-type regions 524 will diffuse during the subsequent annealing processes thereby forming a series of N-type sub-regions that will be seen in later figures. In one example, the N-type implant 519 uses phosphorus and may have a total dose of about $1 \times 10^{13}$ cm$^{-2}$ to $1 \times 10^{14}$ cm$^{-2}$ and an energy of, for example, 250 keV to 600 keV and the N-type implant 521 may use phosphorus and arsenic and possibly antimony and may have a total dose of about $1 \times 10^{15}$ cm$^{-2}$ to $1 \times 10^{16}$ cm$^{-2}$ and an energy to provide an average depth of 50 nanometers to 200 nanometers The substrate is then annealed, the first N-type dopant thereby forming a plurality of respective first N-type sub-regions having a first N-type dopant concentration and a combination of the first N-type dopant and the second N-type dopant thereby forming a plurality of respective second N-type sub-regions having a second N-type dopant concentration that is greater than the first N-type dopant concentration.

One implementation of implanting the P-type dopant in the P-type epitaxial layer over both the first and second P-type buried regions and over each N-type buried region is seen in FIG. 5D. The photoresist layer 520 and oxide layer 518 from FIG. 5C have been removed, and a photoresist layer 528 has been deposited and patterned over an oxide layer 526. P-type implant 527 creates P-type regions 530, which overlie both the P-type buried regions 514 and the N-type buried regions 516. In one example, P-type implant 527 uses boron and may have a total dose of about $1 \times 10^{15}$ cm$^{-2}$ to about $1 \times 10^{16}$ cm$^{-2}$. This is followed by annealing the substrate, thereby forming each of a first P-type surface region 532A, a second P-type surface region 532C, a third P-type surface region 532B, and a fourth P-type surface region 532D (shown in FIG. 5E). Oxide layer 526 is subsequently removed.

Returning again to FIG. 4, the method next forms 425 a plurality of deep trench isolation structures that reach below the plurality of N-type buried regions and the plurality of P-type buried regions. A first deep trench isolation structure surrounds the first N-type surface region and the first P-type surface region; a second deep trench isolation structure surrounds the third P-type surface region; a third deep trench isolation structure surrounds the second N-type surface region and the second P-type surface region; and a fourth deep trench isolation structure surrounds the fourth P-type surface region.

Formation of the deep trench isolation structures is shown at two points in the process. FIG. 5E depicts a stage after the P-type regions 530 have diffused to form a first P-type surface region 532A over first P-type buried region 514A and a second P-type surface region 532C over second P-type buried region 514B and to also form third P-type surface region 532B over first N-type buried region 516A and fourth P-type surface region 532D over second N-type buried region 516B. The first set of N-type regions 522 and second set of N-type regions 524 have diffused to form a first N-type surface region 534A/536A over first P-type buried region 514A, a second N-type surface region 5346/536B over second P-type buried region 514B and third N-type surface region 534C/536C over third P-type buried region 514C. A hardmask layer 540 has been deposited and patterned, and deep trenches 542 have been etched.

FIG. 5F depicts a stage in which hardmask layer 540 has been removed. A layer of oxide 544 has been formed on the sidewalls of deep trenches 542 and polysilicon 546 has been deposited to fill the deep trenches 542. The first deep trench isolation structure 550 surrounds first P-type buried region 514A, first P-type surface region 532A, and a first N-type surface region that includes first N-type sub-region 534A and second N-type sub-region 536A. The second deep trench isolation structure 552 surrounds first N-type buried region 516A and third P-type surface region 532B. The third deep trench isolation structure 554 surrounds second P-type buried region 514B, second P-type surface region 532C, and a second N-type surface region that includes third N-type sub-region 534B and fourth N-type sub-region 536B. The fourth deep trench isolation structure 556 surrounds second N-type buried region 516B and fourth P-type surface region 532D. The fifth deep trench isolation structure 558 surrounds third P-type buried region 514C and a third N-type surface region that includes fifth N-type sub-region 534C and sixth N-type sub-region 536C.

Figure 4A:
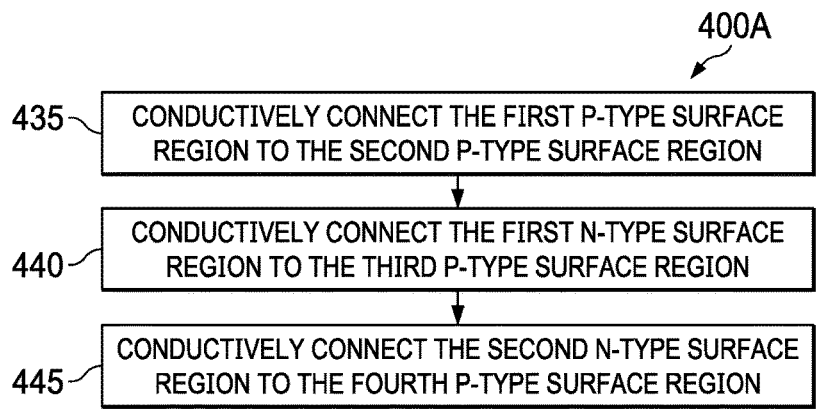
FIGS. 4A-4D each add to the method of FIG. 4 and depict additional elements, optional elements, or further explanation of an element.

FIG. 4A depicts additional elements that may be part of method 400. Method 400A begins with conductively connecting 435 the first P-type surface region, e.g. 532A, to the second P-type surface region, e.g. 532C; continues with conductively connecting 440 the first N-type surface region, e.g. 534A/536A, to the third P-type surface region, e.g. 530B, and also includes conductively connecting 445 the second N-type surface region, e.g. 534B/536B, to the fourth P-type surface region e.g. 530D.

Figure 4B:
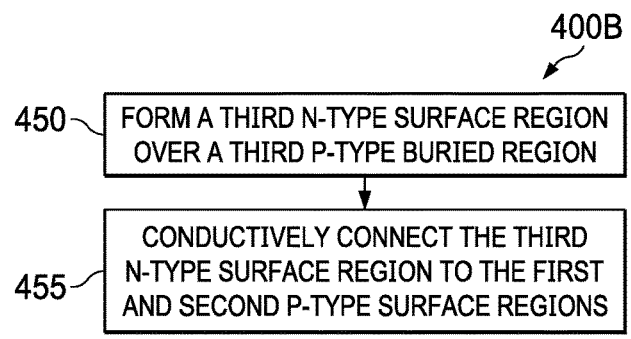

FIG. 4B depicts further elements that may be part of method 400. Method 400B begins with forming 450 a third N-type surface region, e.g. 534C/536C, over a third P-type buried region, e.g. 514C, and continues with conductively connecting 455 the third N-type surface region to the first and second P-type surface regions, e.g. 532A and 532C. These elements may be used to provide snapback in the operating circuit.

Figure 4C:
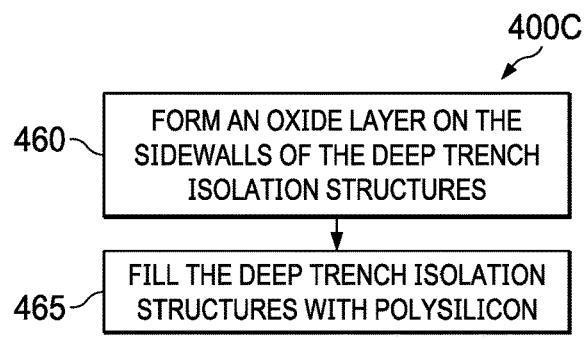

FIG. 4C depicts further details that may be utilized in forming the deep trench isolation structures. Method 400C begins with forming 460 an oxide layer, e.g. 544, on the sidewalls of the deep trench isolation structures and continues with filling 465 the deep trench isolation structures with polysilicon, e.g. 546 (FIG. 5F).

Figure 4D:
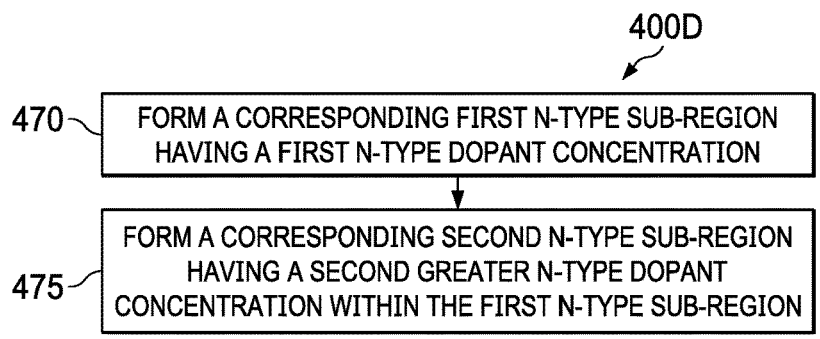

FIG. 4D depicts further details that may be utilized in forming the first N-type surface region, e.g. 534A/536A, and the second N-type surface region, e.g. 534B/536B. Method 400D begins with forming 470 a corresponding first N-type sub-region having a first N-type dopant concentration and also includes forming 475 a corresponding second N-type sub-region having a second greater N-type dopant concentration within the first N-type sub-region.

The disclosed examples utilize a vertical diode process that includes a lateral diode. This arrangement can provide connections on a single side of the substrate to a ground pin and to one or more I/O pins. A single die can now include multi-channel unidirectional diode arrays. The cost of implementation is thereby reduced and greater flexibility is provided in designing leadframes for multi-channel implementations. These benefits can be enjoyed while still decreasing the size of the die as compared to an entirely lateral implementation.

Although various examples have been shown and described in detail, the claims are not limited to any particular example or examples. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described examples that are known to those of ordinary skill in the art are expressly incorporated herein by reference and are intended to be encompassed by the present claims. Accordingly, those skilled in the art will recognize that the exemplary examples described herein can be practiced with various modifications and alterations within the spirit and scope of the claims appended below.

What is claimed is:

1. An electronic device comprising:
   an epitaxial layer having a first surface and being located over a substrate having a first conductivity type, the epitaxial layer having a second conductivity type and a first dopant concentration, the substrate having a second surface opposing the first surface;
   a first substrate region comprising a first buried layer having the second conductivity type, the first substrate region being enclosed by a first deep isolation structure that extends from the first surface to a level below the first buried layer;
   a first doped region located within the first substrate region at the first surface, the first doped region touching the epitaxial layer and having the second conductivity type with a dopant concentration greater than the first dopant concentration;
   a second doped region located within the first substrate region at the first surface, the second doped region having the first conductivity type;
   a second substrate region comprising a second buried layer having the first conductivity type, the second substrate region being enclosed by a second deep isolation structure that extends from the first surface to a level below the second buried layer; and
   a third doped region located within the second substrate region at the first surface, the third doped region having the second conductivity type and a dopant concentration greater than the first dopant concentrations;
   a third substrate region comprising a third buried layer having the second conductivity type, the third substrate region being enclosed by a third deep isolation structure that extends from the first surface to a level below the third buried layer;
   a fourth doped region located within the third substrate region at the first surface, the third doped region having the second conductivity type and a dopant concentration greater than the first dopant concentration;
   a fifth doped region located within the third substrate region at the first surface, the fifth doped region having the first conductivity type;
   a fourth substrate region comprising a fourth buried layer having the first conductivity type, the fourth substrate region being enclosed by a fourth deep isolation structure extending from the first surface to a level below the fourth buried layer; and
   a sixth doped region located within the fourth substrate region at the first surface, the sixth doped region having the second conductivity type and a dopant concentration greater than the first dopant concentration,
   wherein the second doped region comprises a first sub-region having a second dopant concentration and a second sub-region having a dopant concentration greater than the second dopant concentration and the fifth doped region comprises a third sub-region having a third dopant concentration and a fourth sub-region having a dopant concentration greater than the third dopant concentration.

2. The electronic device as recited in claim 1 wherein the second doped region comprises a first sub-region having a second dopant concentration and a second sub-region having a dopant concentration greater than the second dopant concentration.

3. The electronic device as recited in claim 1 further comprising:
   a first metal routing segment conductively coupled to the first doped region; and
   a second metal routing segment conductively coupled to the second doped region and to the third doped region.

4. The electronic device as recited in claim 1 further comprising:
   a first metal routing segment conductively coupled to the first and fourth doped regions;
   a second metal routing segment conductively coupled to the second doped region and to the third doped region; and
   a third metal routing segment conductively coupled to the fifth doped region and to the sixth doped region.

5. The electronic device as recited in claim 1 further comprising:
   a fifth substrate region comprising a fifth buried layer having the second conductivity type, the fifth substrate region being enclosed by a fifth deep isolation structure extending from the first surface to a level below the fifth buried layer; and a seventh doped region located within the fifth substrate region at the first surface, the seventh doped region having the first conductivity type.

6. The electronic device as recited in claim 5 wherein the second doped region comprises a first sub-region having a second dopant concentration and a second sub-region having a dopant concentration greater than the second dopant concentration, the fifth doped region comprises a third sub-region having a third dopant concentration and a fourth sub-region having a dopant concentration greater than the third dopant concentration, and the seventh doped region comprises a fifth sub-region having a fourth dopant concentration and a sixth sub-region having a dopant concentration greater than the fourth dopant concentration.

7. The electronic device as recited in claim 5 further comprising:
a first metal routing segment conductively coupled to the first, fourth and seventh doped regions;
a second metal routing segment conductively coupled to the second doped region and to the third doped region; and
a third metal routing segment conductively coupled to the fifth doped region and to the sixth doped region.

8. The electronic device as recited in claim 5 further comprising a leadframe to which the second surface is attached with a non-conductive adhesive.

9. The electronic device as recited in claim 5 wherein the substrate is packaged as a wafer-level chip-scale package (WCSP).

10. The electronic device as recited in claim 1 wherein the second buried layer comprises a portion of another epitaxial layer having the first conductivity type.

11. The electronic device as recited in claim 1 wherein the first conductivity type is N-type and the second conductivity type is P-type.

12. An electrostatic discharge ESD protection device comprising:
a substrate that is N-type and has a bottom surface;
a first epitaxial layer that is N-type located over the substrate;
a second epitaxial layer that is P-type and located over the first epitaxial layer, the second epitaxial layer having a first P-type dopant concentration and a top surface opposed to the bottom surface;
a first doped region that is P-type formed at the top surface, the first doped region having a P-type dopant concentration different than the first P-type dopant concentration;
a second doped region formed at the top surface, the second doped region being N-type;
a first buried layer located between the substrate and the second epitaxial layer;
a first deep isolation structure enclosing the first doped region, the second doped region, and the first buried layer;
a third doped region formed at the top surface, the third doped region being P-type and having a dopant concentration different than the first P-type dopant concentration, the first epitaxial layer forming a second buried layer between the substrate and the third doped region; and a second deep isolation structure enclosing the third doped region and the second buried layer.

13. The ESD protection device as recited in claim 12 further comprising:
a fourth doped region intersecting the top surface, the fourth doped region being P-type;
a fifth doped region intersecting the top surface, the fifth doped region being N-type;
a third buried layer located between the substrate and the fourth doped region, the third buried layer being P-type;
a third deep isolation structure enclosing the third doped region, the fourth doped region, the fifth doped region and the third buried layer;
an sixth doped region intersecting the top surface, the sixth doped region being P-type, the first epitaxial layer forming a fourth buried layer between the substrate and the sixth doped region; and
a fourth deep isolation structure enclosing the fourth doped region and the fourth buried layer.

14. The ESD protection device as recited in claim 13 further comprising:
a seventh doped region intersecting the first surface of the substrate, the seventh doped region being N-type;
a fifth buried layer located between the substrate and the seventh doped region, the fifth buried layer being P-type.

15. A method of fabricating an integrated circuit (IC), comprising:
implanting a first P-type dopant in an N-type epitaxial layer thereby forming a plurality of buried layer implanted regions;
forming a P-type epitaxial layer over the N-type epitaxial layer, the P-type epitaxial layer having a first surface, the buried layer implanted regions thereby forming a plurality of P-type buried regions, each adjacent pair of P-type buried regions being laterally separated by a corresponding one of a plurality of N-type buried regions;
over each P-type buried region, implanting an N-type dopant in the P-type epitaxial layer, and implanting a P-type dopant in the P-type epitaxial layer, thereby forming a first N-type surface region and a first P-type surface region over a first P-type buried region, and forming a second N-type surface region and a second P-type surface region over a second P-type buried region;
over each N-type buried region, implanting a P-type dopant in the P-type epitaxial layer, thereby forming a third P-type surface region over a first N-type buried region, and forming a fourth P-type surface region over second N-type buried region;
forming a plurality of deep trench isolation structures that reach below the plurality of N-type buried regions and the plurality of P-type buried regions, a first deep trench isolation structure surrounding the first N-type surface region and the first P-type surface region, a second deep trench isolation structure surrounding the third P-type surface region, a third deep trench isolation structure surrounding the second N-type surface region and the second P-type surface region, and a fourth deep trench isolation structure surrounding the fourth P-type surface region.

16. The method as recited in claim 15 wherein forming the plurality of deep trench isolation structures comprises forming an oxide layer on the sidewalls of the deep trench isolation structures and filling the deep trench isolation structures with polysilicon.

17. The method as recited in claim 15 further comprising conductively connecting the first P-type surface region to the second P-type surface region, conductively connecting the first N-type surface region to the third P-type surface region, and conductively connecting the second N-type surface region to the fourth P-type surface region.

18. The method as recited in claim 17 further comprising forming a third N-type surface region over a third P-type buried region, and conductively connecting the third N-type surface region to the first and second P-type surface regions.

19. The method as recited in claim 15 wherein forming each of the first and second N-type surface regions comprises forming a corresponding first N-type sub-region having a first N-type dopant concentration, and forming a corresponding second N-type sub-region having a second greater N-type dopant concentration within the first N-type sub-region.

20. The method as recited in claim 15 wherein the first N-type surface region is spaced apart from the first P-type surface region by a first portion of the P-type epitaxial layer, and the second N-type surface region is spaced apart from the second P-type surface region by a second portion of the P-type epitaxial layer.

21. An electronic device comprising:
a P-type epitaxial layer having a first surface and being located over an N-type substrate, the epitaxial layer having a first dopant concentration, and the substrate having a second surface opposing the first surface;
first and second diodes in a first substrate region that includes a P-type buried layer enclosed by a first deep isolation structure that extends from the first surface to the substrate,
   the first diode having a first anode including a first P-type region at the first surface and the P-type buried layer, and a first cathode including the substrate, and
   the second diode having a first anode including the first P-type region and a second cathode including an N-type region at the first surface; and
a third diode in a second substrate region that includes an N-type buried layer enclosed by a second deep isolation structure that extends from the first surface to the substrate, the third diode having a third anode including a second P-type region at the first surface and a third cathode including the substrate.

22. The electronic device as recited in claim 21, wherein the second cathode and the third anode are conductively connected, and the first and second anodes are grounded.

23. The electronic device as recited in claim 21, wherein the second cathode is conductively connected to the third anode and to a protected I/O node.

* * * * *